(12) United States Patent
Xu et al.

(10) Patent No.: US 12,370,646 B2
(45) Date of Patent: *Jul. 29, 2025

(54) POLISHING APPARATUS USING MACHINE LEARNING AND COMPENSATION FOR PAD THICKNESS

(71) Applicant: Applied Materials, Inc., Santa Clara, CA (US)

(72) Inventors: Kun Xu, Sunol, CA (US); Denis Ivanov, St. Petersburg (RU); Harry Q. Lee, Los Altos, CA (US); Jun Qian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 152 days.

This patent is subject to a terminal disclaimer.

(21) Appl. No.: 17/993,471

(22) Filed: Nov. 23, 2022

(65) Prior Publication Data

US 2023/0085787 A1   Mar. 23, 2023

Related U.S. Application Data

(63) Continuation of application No. 16/368,649, filed on Mar. 28, 2019, now Pat. No. 11,524,382.

(Continued)

(51) Int. Cl.
*B24B 37/005*   (2012.01)
*B24B 49/10*   (2006.01)
(Continued)

(52) U.S. Cl.
CPC .......... *B24B 37/005* (2013.01); *B24B 49/105* (2013.01); *G05B 19/048* (2013.01);
(Continued)

(58) Field of Classification Search
None
See application file for complete search history.

(56) References Cited

U.S. PATENT DOCUMENTS

| 5,433,651 A | 7/1995 | Lustig |
| 5,559,428 A | 9/1996 | Li et al. |

(Continued)

FOREIGN PATENT DOCUMENTS

| CN | 201166564 | 12/2008 |
| CN | 102278967 | 12/2011 |

(Continued)

OTHER PUBLICATIONS

Office Action in Chinese Appln. No. 202210494281.5, dated Sep. 19, 2023, 19 pages (with English translation).

(Continued)

*Primary Examiner* — Kyoung Lee
(74) *Attorney, Agent, or Firm* — Fish & Richardson P.C.

(57) ABSTRACT

Data received from an in-situ monitoring system includes, for each scan of a sensor, a plurality of measured signal values for a plurality of different locations on a layer. A thickness of a polishing pad is determined based on the data from the in-situ monitoring system. For each scan, a portion of the measured signal values are adjusted based on the thickness of the polishing pad. For each scan of the plurality of scans and each location of the plurality of different locations, a value is generated representing a thickness of the layer at the location. This includes processing the adjusted signal values using one or more processors configured by machine learning. A polishing endpoint is detected or a polishing parameter is modified based on the values representing the thicknesses at the plurality of different locations.

19 Claims, 9 Drawing Sheets

Related U.S. Application Data

(60) Provisional application No. 62/652,286, filed on Apr. 3, 2018.

(51) Int. Cl.
  *G05B 19/048* (2006.01)
  *G06N 3/063* (2023.01)
  *G06N 20/00* (2019.01)
  *H01L 21/67* (2006.01)

(52) U.S. Cl.
  CPC ............ *G06N 3/063* (2013.01); *G06N 20/00* (2019.01); *H01L 21/67092* (2013.01); *H01L 21/67253* (2013.01)

(56) References Cited

U.S. PATENT DOCUMENTS

| | | | |
|---|---|---|---|
| 5,644,221 A | 7/1997 | Li et al. | |
| 5,660,672 A | 8/1997 | Li et al. | |
| 5,700,180 A | 12/1997 | Sandhu et al. | |
| 5,832,466 A | 11/1998 | Feldgajer | |
| 6,004,187 A | 12/1999 | Nyui et al. | |
| 6,072,313 A | 6/2000 | Li et al. | |
| 6,159,073 A | 12/2000 | Wiswesser et al. | |
| 6,172,756 B1 | 1/2001 | Geels et al. | |
| 6,179,709 B1 | 1/2001 | Redeker et al. | |
| 6,190,234 B1 | 2/2001 | Swedek et al. | |
| 6,280,289 B1 | 8/2001 | Wiswesser et al. | |
| 6,296,548 B1 | 10/2001 | Wiswesser et al. | |
| 6,399,501 B2 | 6/2002 | Birang et al. | |
| 6,407,546 B1 | 6/2002 | Le et al. | |
| 6,433,541 B1 | 8/2002 | Lehman et al. | |
| 6,524,165 B1 | 2/2003 | Wiswesser et al. | |
| 6,558,229 B2 | 5/2003 | Kimura et al. | |
| 6,594,024 B1 | 7/2003 | Singh et al. | |
| 6,602,724 B2 | 8/2003 | Redeker et al. | |
| 6,707,540 B1 | 3/2004 | Lehman et al. | |
| 6,924,641 B1 | 8/2005 | Hanawa et al. | |
| 6,945,845 B2 | 9/2005 | Bennett et al. | |
| 6,975,107 B2 | 12/2005 | Hanawa et al. | |
| 7,001,243 B1 | 2/2006 | Yi et al. | |
| 7,008,296 B2 | 3/2006 | Swedek et al. | |
| 7,016,795 B2 | 3/2006 | Swedek et al. | |
| 7,025,658 B2 | 4/2006 | David | |
| 7,097,537 B1 | 8/2006 | David | |
| 7,112,960 B2 | 9/2006 | Miller et al. | |
| 7,118,450 B2 | 10/2006 | Birang et al. | |
| 7,082,345 B2 | 12/2006 | Shanmugasundram et al. | |
| 7,153,185 B1 | 12/2006 | Birang et al. | |
| 7,189,140 B1 | 3/2007 | Shugrue et al. | |
| 8,010,222 B2 | 8/2011 | Lehman et al. | |
| 8,106,651 B2 | 1/2012 | Lahiri et al. | |
| 8,246,417 B2 | 8/2012 | Kobayashi et al. | |
| 8,284,560 B2 | 10/2012 | Iravani et al. | |
| 8,367,429 B2 | 2/2013 | Lee et al. | |
| 8,408,965 B2 | 4/2013 | Bennett et al. | |
| 9,142,466 B2 | 9/2015 | Lee et al. | |
| 9,205,527 B2 | 12/2015 | Xu et al. | |
| 9,281,253 B2 | 3/2016 | Xu et al. | |
| 9,490,186 B2 | 11/2016 | Benvegnu et al. | |
| 9,636,797 B2 | 5/2017 | Xu et al. | |
| 10,478,937 B2 | 11/2019 | Tang et al. | |
| 10,921,789 B2 | 2/2021 | Kadokura | |
| 10,994,389 B2 | 5/2021 | Xu et al. | |
| 11,524,382 B2 * | 12/2022 | Xu ..................... B24B 49/105 | |
| 11,580,375 B2 | 2/2023 | Bhaskar et al. | |
| 11,618,499 B2 | 4/2023 | Bouchet | |
| 11,780,047 B2 | 10/2023 | Xu et al. | |
| 2001/0008827 A1 | 7/2001 | Kimura et al. | |
| 2002/0002029 A1 | 1/2002 | Kimura et al. | |
| 2002/0013007 A1 | 1/2002 | Hasegawa et al. | |
| 2002/0013124 A1 | 1/2002 | Tsujimura et al. | |
| 2002/0055192 A1 | 5/2002 | Redeker et al. | |
| 2002/0077031 A1 | 6/2002 | Johansson et al. | |
| 2002/0098777 A1 | 7/2002 | Laursen et al. | |
| 2002/0103564 A1 | 8/2002 | Fielden et al. | |
| 2002/0155789 A1 | 10/2002 | Bibby, Jr. et al. | |
| 2002/0164925 A1 | 11/2002 | Swedek et al. | |
| 2002/0192966 A1 | 12/2002 | Shanmugasundram et al. | |
| 2003/0028279 A1 | 2/2003 | Wang et al. | |
| 2003/0053042 A1 | 3/2003 | Chen | |
| 2003/0087459 A1 | 5/2003 | Laursen et al. | |
| 2004/0119468 A1 | 6/2004 | Gotkis et al. | |
| 2004/0259470 A1 | 12/2004 | Swedek et al. | |
| 2005/0018183 A1 | 1/2005 | Shortt | |
| 2005/0024047 A1 | 2/2005 | Miller et al. | |
| 2006/0009132 A1 | 1/2006 | Bennett et al. | |
| 2007/0061036 A1 | 3/2007 | Sakurai et al. | |
| 2007/0103150 A1 | 5/2007 | Tada et al. | |
| 2007/0205765 A1 | 9/2007 | Bailey | |
| 2007/0251922 A1 | 11/2007 | Swedek et al. | |
| 2008/0057830 A1 | 3/2008 | Molnar | |
| 2008/0139087 A1 | 6/2008 | Togawa et al. | |
| 2008/0183312 A1 | 7/2008 | Funk et al. | |
| 2009/0104847 A1 | 4/2009 | Kobayashi et al. | |
| 2009/0156098 A1 | 6/2009 | Swedek et al. | |
| 2009/0263918 A1 | 10/2009 | Lahiri et al. | |
| 2009/0299930 A1 | 12/2009 | Konermann et al. | |
| 2010/0099334 A1 | 4/2010 | Bennett et al. | |
| 2011/0124269 A1 | 5/2011 | Tada et al. | |
| 2011/0189925 A1 | 8/2011 | Iravani et al. | |
| 2011/0318992 A1 | 12/2011 | David et al. | |
| 2012/0034845 A1 | 2/2012 | Hu et al. | |
| 2012/0064800 A1 | 3/2012 | Watanabe et al. | |
| 2012/0276661 A1 | 11/2012 | Iravani et al. | |
| 2013/0000845 A1 | 1/2013 | Lu et al. | |
| 2013/0273812 A1 | 10/2013 | Qian et al. | |
| 2013/0337722 A1 | 12/2013 | Namiki et al. | |
| 2015/0118765 A1 | 4/2015 | Xu et al. | |
| 2015/0118766 A1 | 4/2015 | Xu et al. | |
| 2015/0224623 A1 | 8/2015 | Xu et al. | |
| 2015/0371907 A1 | 12/2015 | Lu et al. | |
| 2015/0371913 A1 | 12/2015 | Zhefu et al. | |
| 2016/0016279 A1 | 1/2016 | Gurusamy et al. | |
| 2016/0361791 A1 | 12/2016 | Economikos et al. | |
| 2018/0056476 A1 | 3/2018 | Zhang et al. | |
| 2018/0203089 A1 | 7/2018 | Xu et al. | |
| 2018/0203090 A1 | 7/2018 | Xu et al. | |
| 2018/0304435 A1 | 10/2018 | Xu et al. | |
| 2019/0095797 A1 | 3/2019 | Dhandapani et al. | |
| 2019/0120610 A1 | 4/2019 | Wu et al. | |
| 2019/0299356 A1 | 10/2019 | Xu et al. | |
| 2020/0101579 A1 | 4/2020 | Suzuki | |
| 2020/0130136 A1 | 4/2020 | Huang et al. | |
| 2020/0398890 A1 | 12/2020 | Bouchet | |
| 2021/0229234 A1 | 7/2021 | Xu et al. | |
| 2021/0379723 A1 | 12/2021 | Xu et al. | |
| 2021/0402551 A1 | 12/2021 | Xu et al. | |
| 2022/0115275 A1 | 4/2022 | Pandit | |
| 2023/0381912 A1 | 11/2023 | Xu et al. | |

FOREIGN PATENT DOCUMENTS

| | | |
|---|---|---|
| CN | 102398210 | 4/2012 |
| CN | 102626895 | 8/2012 |
| CN | 102683237 | 9/2012 |
| CN | 105659363 | 6/2016 |
| CN | 106625201 | 5/2017 |
| CN | 107369635 | 11/2017 |
| CN | 108573310 | 9/2018 |
| CN | 111185845 | 5/2020 |
| EP | 1063056 | 12/2000 |
| JP | 2004-525521 | 8/2004 |
| JP | 2005-034992 | 2/2005 |
| JP | 2005-518654 | 6/2005 |
| JP | 2007-501509 | 1/2007 |
| JP | 2007-083359 | 4/2007 |
| JP | 2009-004442 | 1/2009 |
| JP | 2009-099842 | 5/2009 |
| JP | 2011-023579 | 2/2011 |
| JP | 2011-164110 | 8/2011 |
| JP | 2012-506152 | 3/2012 |
| JP | 2014-096585 | 5/2014 |

(56) References Cited

FOREIGN PATENT DOCUMENTS

| | | |
|---|---|---|
| JP | 2016-538728 | 12/2016 |
| JP | 2017-506438 | 3/2017 |
| JP | 2019-139755 | 8/2019 |
| JP | 2021-515511 | 6/2021 |
| KR | 10-0769566 | 10/2007 |
| KR | 10-2008-0082012 | 9/2008 |
| KR | 10-2016-0052216 | 5/2016 |
| KR | 10-2016-0103791 | 9/2016 |
| KR | 10-2016-0148676 | 12/2016 |
| KR | 10-2017-0015406 | 2/2017 |
| KR | 10-2017-0071609 | 6/2017 |
| KR | 10-2020-0047739 | 5/2020 |
| TW | 393563 | 6/2000 |
| TW | I221435 | 10/2004 |
| TW | 201249598 | 12/2012 |
| TW | 201400239 | 1/2014 |
| TW | 201945118 | 12/2019 |
| WO | WO 1997/021070 | 6/1997 |
| WO | WO 2001/046684 | 6/1999 |
| WO | WO 2002/087825 | 11/2002 |
| WO | WO 2004/059242 | 7/2004 |
| WO | WO 2008/032753 | 1/2008 |
| WO | WO 2012/148716 | 11/2012 |
| WO | WO 2020/067914 | 4/2020 |

OTHER PUBLICATIONS

Zhang et al, "Artificial Neural Network Modeling For Experiments of Electrical Discharge Grinding of Polycrystalline Diamond," Diamond & Abrasives Engineering, Jun. 30, 2004, 141(3):14-16 (with English abstract).
International Search Report and Written Opinion in International Appln. No. PCT/US2019/024687, dated Aug. 6, 2019, 10 pages.
Office Action in Chinese Appln. No. 201980005214.9 dated Feb. 19, 2021, 11 pages (with English translation).
Office Action in Japanese Appln. No. 2020-552818, dated Jan. 4, 2022, 12 pages (with English translation).
Office Action in Korean Appln. No. 10-2020-7031741, dated Mar. 24, 2022, 21 pages (with English translation).
Zheng et al., "Research on Oil Film Thickness Measuring System of the Thrust Bearing Test Board," Large Electric Machine and Hydraulic Turbine, Jan. 29, 2001, 9 pages (with English translation).

\* cited by examiner

POLISHING APPARATUS USING MACHINE LEARNING AND COMPENSATION FOR PAD THICKNESS

CROSS-REFERENCE TO RELATED APPLICATIONS

This application is a continuation of U.S. application Ser. No. 16/368,649, filed on Mar. 28, 2019, which claims priority to U.S. Provisional Application Ser. No. 62/652,286, filed on Apr. 3, 2018, the entire disclosure of which is incorporated by reference.

TECHNICAL FIELD

The present disclosure relates to in-situ monitoring during polishing of a substrate.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In one aspect, a method of polishing a substrate includes bringing the substrate into contact with a polishing pad, moving the substrate relative to the polishing pad to polish a layer on the substrate, and monitoring the layer during polishing at the polishing station with a sensor of an in-situ monitoring system. The sensor moves relative to the substrate to provide a plurality of scans of the sensor across the substrate, and the in-situ monitoring system generating data including, for each scan of the plurality of scans, a plurality of measured signal values for a plurality of different locations on the layer. A thickness of the polishing pad is determined based on the data from the in-situ monitoring system. For each scan of the plurality of scans, at least a portion of the plurality of measured signal values is adjusted based on the thickness of the polishing pad to provide a plurality of adjusted signal values. For each scan of the plurality of scans, for each location of the plurality of different locations, a value is generated representing a thickness of the layer at the location, thereby providing a plurality of values representing thicknesses at the plurality of different locations. The generating includes processing at least the plurality of adjusted signal values using one or more processors configured by machine learning. A polishing endpoint is detected and/or a polishing parameter is modified based on the plurality of values representing the thicknesses at the plurality of different locations.

In another aspect, a polishing system includes a support for a polishing pad, a carrier to hold a substrate in contact with the polishing pad, an in-situ monitoring system having a sensor, a motor to generate relative motion between the sensor and the substrate such that the sensor makes a plurality of scans across the substrate, and a controller. The in-situ monitoring system is configured to generate data including, for each scan of the plurality of scans, a plurality of measured signal values for a plurality of different locations on the layer. The controller is configured to receive the data from the in-situ monitoring system, determine a thickness of the polishing pad based on the data from the in-situ monitoring system, for each scan of the plurality of scans adjust at least a portion of the plurality of measured signal values based on the thickness of the polishing pad to provide a plurality of adjusted signal values, for each scan of the plurality of scans generated for each location of the plurality of different locations a value representing a thickness of the layer at the location, thereby providing a plurality of values representing thicknesses at the plurality of different locations, wherein the generating includes processing at least the plurality of adjusted signal values using one or more processors configured by machine learning, and at least one of detect a polishing endpoint or modify a polishing parameter based on the plurality of values representing the thicknesses at the plurality of different locations.

In another aspect, a computer storage medium is encoded with instructions that, when executed by one or more computers, cause the one or more computers to perform operations. Data is received from the in-situ monitoring system, the data including, for each scan of the plurality of scans of a sensor of the in-situ monitoring system, a plurality of measured signal values for a plurality of different locations on the layer. A thickness of the polishing pad is determined based on the data from the in-situ monitoring system. For each scan of the plurality of scans, at least a portion of the plurality of measured signal values is adjusted based on the thickness of the polishing pad to provide a plurality of adjusted signal values. For each scan of the plurality of scans, for each location of the plurality of different locations, a value is generated representing a thickness of the layer at the location, thereby providing a plurality of values representing thicknesses at the plurality of different locations. The value is generated by processing at least the plurality of adjusted signal values using one or more processors configured by machine learning. A polishing endpoint is detected or a polishing parameter is modified based on the plurality of values representing the thicknesses at the plurality of different locations.

Implementations may include one or more of the following features.

The thickness of the polishing pad may be represented as an amount of pad wear of the polishing pad or as an actual thickness of the polishing pad.

A gain for the substrate may be measured, and the thickness of the polishing pad may be determined from a correlation function that provides pad thickness values as a function of gain. Determining the gain for the substrate may include determining an estimated starting thickness value of the layer based on the plurality of values representing thicknesses for a plurality of scans occurring in an initial portion of a polishing operation of the layer. An initial thickness value of the layer may be measured prior to polishing, wherein determining the gain comprises comparing the estimated starting thickness value to the measured starting thickness value. The sensor may generate a plurality of raw thickness values, and after determining the gain, the plurality of raw thickness values may be multiplied by the gain to generate the plurality of measured signal values.

A convolution on the at least the portion of the plurality of measured signal values may be performed to adjust at least the portion of the plurality of measured signal values. The convolution may be a Gaussian function of wear of the polishing pad to scale the measured signal value to a signal value at zero pad wear.

The plurality of different locations on the layer may include at least one edge location in an edge region of the substrate, at least one central location in a central region of the substrate, and at least one anchor location in an anchor region between the central region and the edge region. The at least a portion of the plurality of measured signal values may include measured signal values corresponding to the edge region, and may include measured signal values corresponding to the anchor region, but need not include measured signal values corresponding to the central region.

Processing at least the plurality of adjusted signal values may include outputting modified signal values. The plurality of values representing thicknesses may be calculated using a correlation curve that provides layer thickness value as a function of signal value. The at least a portion of the plurality of measured signal values may include less than all of the plurality of measured signal values.

A first group of values may be calculated from the plurality of values representing thicknesses based on the plurality of modified signal values, and a second group of values may be calculated from the plurality of values representing thickness based on of a remainder of measured signal values that are not in the portion of the plurality of measured signal value. The first group of values may include values from locations in an edge region of the substrate, and the second group of values may include values from locations in a center region of the substrate.

Processing the at least the plurality of adjusted signal values may include inputting the plurality of adjusted signal values to a neural network. The neural network may include one or more neural network layers including an input layer, an output layer, and one or more hidden layers. Each neural network layer may include one or more neural network nodes, and each neural network node may be configured to process an input in accordance with a set of parameters to generate an output.

A ground truth measure of thickness may be received for each location of one or more different locations of the layer, a measure of error may be computed between the estimated measure thickness for each location and the corresponding ground truth measures of thickness for the location, and the parameters of the neural network system may be updated based on the measure of error. The ground truth measure may be a measurement with a four-point probe.

The in-situ monitoring system may include an eddy current monitoring system. Moving the substrate relative to the polishing pad may include rotating a platen holding the platen and the sensor so as to cause the sensor to make a plurality of sweeps across the substrate.

Certain implementations can include one or more of the following advantages. An in-situ monitoring system, e.g., an eddy current monitoring system, can generate a signal as a sensor scans across the substrate. The system can compensate for distortions in a portion of the signal that corresponds to the substrate edge, even in the presence of changes in the thickness of the polishing pad. The signal can be used for endpoint control and/or closed-loop control of polishing parameters, e.g., carrier head pressure, thus providing improved within-wafer non-uniformity (WIWNU) and water-to-wafer non-uniformity (WTWNU).

The details of one or more implementations are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

A polishing apparatus can use an in-situ monitoring system, e.g., an eddy current monitoring system, to detect the thickness of an outer layer that is being polished on a substrate. During polishing of the outer layer, the in-situ monitoring system can determine the thickness of different locations of the layer on the substrate. The thickness measurements can be used to trigger a polishing endpoint and/or to adjust processing parameters of the polishing process in real time. For example, a substrate carrier head can adjust the pressure on the backside of the substrate to increase or decrease the polishing rate of the locations of the outer layer. The polishing rate can be adjusted so that the locations of the layer are substantially the same thickness after polishing. The CMP system can adjust the polishing rate so that polishing of the locations of the layer completes at about the same time. Such profile control can be referred to as real time profile control (RTPC).

An in-situ monitoring system can be subject to signal distortion for measurements at locations close to the substrate edge. For example, an eddy current monitoring system can generate a magnetic field. Near the substrate edge, the signal can be artificially low because the magnetic field only partially overlaps the conductive layer of the substrate. If the polishing apparatus uses a neural network to generate modified signals based on the measured signals generated by the in-situ monitoring system, the apparatus can compensate for the distortions, e.g., reduced signal strength, at the substrate edge.

Unfortunately, changes in the polishing pad thickness can result in changes in sensitivity of the eddy current sensor, which can result in an inaccurate signal at the substrate edge, even given the compensation techniques. Hypothetically a neural network could be trained with data from multiple different pad thicknesses, and a measure of pad thickness used as an input to the neural network. While workable, unfortunately acquisition of such data can be cumbersome and time-consuming. However, the pad thickness can be used to adjust the signal that is input to the neural network, thereby cancelling out distortions in the signal due to changes in the pad thickness.

Figure 1A:
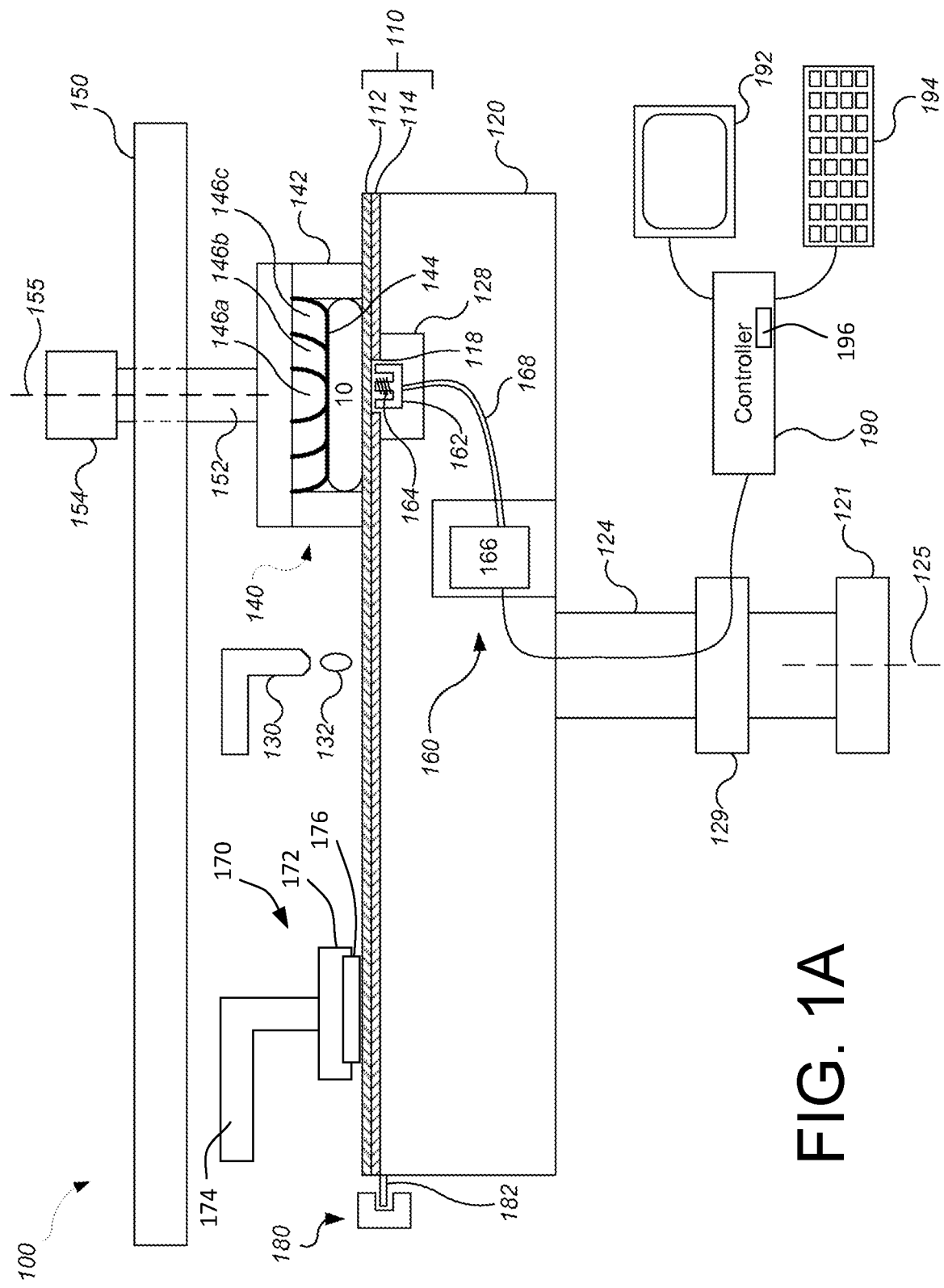
FIG. 1A is a schematic side view, partially cross-sectional, of a chemical mechanical polishing station that includes an eddy current monitoring system.
Figure 1B:
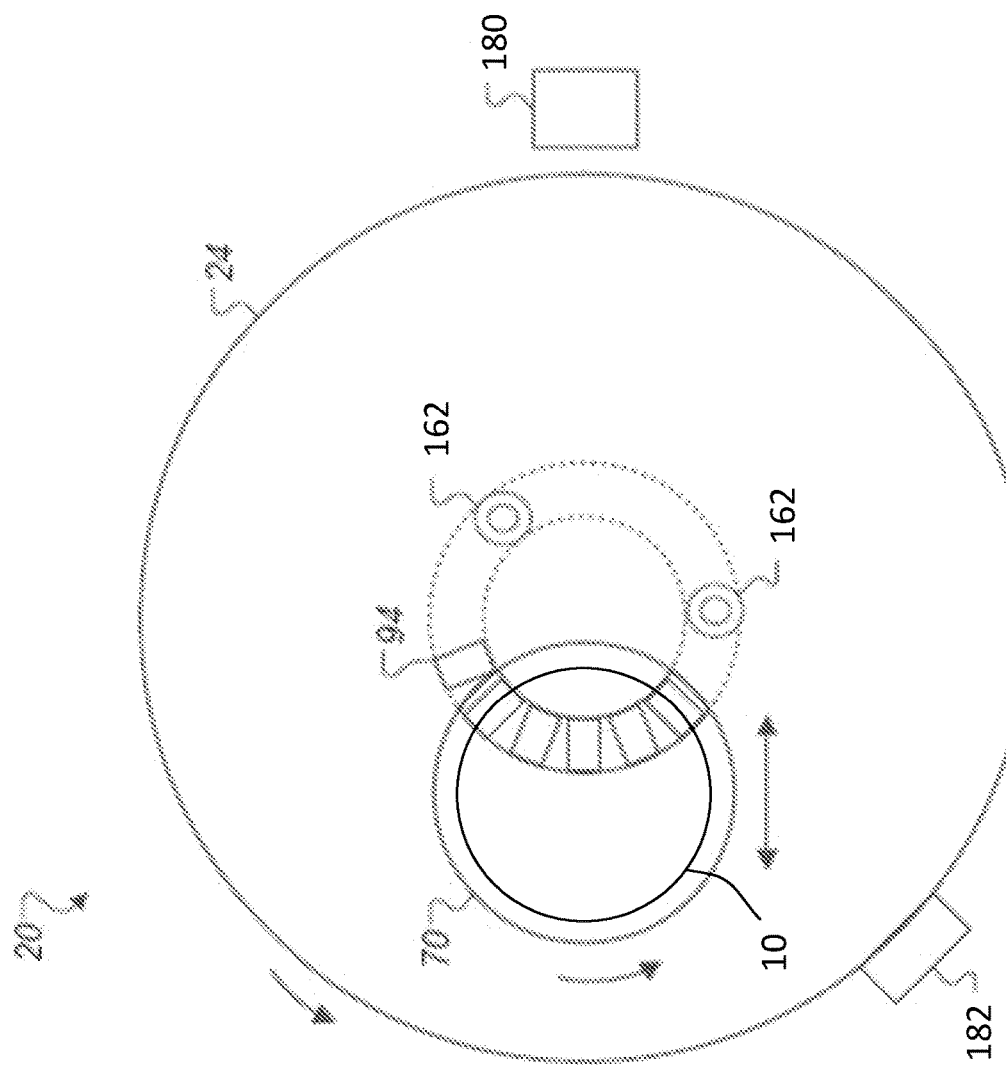
FIG. 1B is a schematic top view of a chemical mechanical polishing station.

FIGS. 1A and 1B illustrate an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as slurry, onto the polishing pad 110.

The polishing apparatus can also include a polishing pad conditioner 170 to abrade the polishing pad 110 to maintain the polishing pad 110 in a consistent abrasive state. In addition, conditioning improves consistency of friction between the substrate and the polishing pad. The polishing pad conditioner 170 can include a conditioner head 172 that permits the conditioner head 172 to sweep radially over the polishing pad 110 as the platen 120 rotates. The conditioner head 172 can hold a conditioner disk 176, e.g., a metal disk having abrasives, e.g., diamond grit, on the lower surface. The conditioning process tends to wear away the polishing pad 110 over time, until the polishing pad 110 needs to be replaced. Thus, after polishing of each substrate 10, the polishing pad 110 tends to be slightly thinner. The pad wear rate can be dynamic, e.g., vary across polishing operations for multiple substrates, and can be dependent on consumables and process conditions.

The polishing apparatus 100 includes at least one carrier head 140. The carrier head 140 is operable to hold a substrate 10 against the polishing pad 110. The carrier head 140 can have independent control of the polishing parameters, for example pressure, associated with each respective substrate.

In particular, the carrier head 140 can include a retaining ring 142 to retain the substrate 10 below a flexible membrane 144. The carrier head 140 also includes a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or a track, and is connected by a drive shaft 152 to a carrier head rotation motor 154 so that the carrier head can rotate about an axis 155. Optionally the carrier head 140 can oscillate laterally, e.g., on sliders on the carousel 150 or track; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus 100 also includes an in-situ monitoring system 160. The in-situ monitoring system 160 generates a time-varying sequence of values that depend on the thickness of a layer on the substrate. The in-situ monitoring system 160 includes a sensor head at which the measurements are generated; due to relative motion between the substrate and the sensor head, measurements will be taken at different locations on the substrate.

The in-situ-monitoring system 160 can be an eddy current monitoring system. The eddy current monitoring system 160 includes a drive system to induce eddy currents in a conductive layer on the substrate and a sensing system to detect eddy currents induced in the conductive layer by the drive system. The monitoring system 160 includes a core 162 positioned in a recess 128 to rotate with the platen, at least one coil 164 wound around a portion of the core 162, and drive and sense circuitry 166 connected by wiring 168 to the coil 164. The combination of the core 162 and coil 164 can provide the sensor head. In some implementations, the core 162 projects above the top surface of the platen 120, e.g., into a recess 118 in the bottom of the polishing pad 110.

The drive and sense circuitry 166 is configured to apply an oscillating electric signal to the coil 164 and to measure the resulting eddy current. A variety of configurations are possible for the drive and sense circuitry and for the configuration and position of the coil(s), e.g., as described in U.S. Pat. Nos. 6,924,641, 7,112,960 and 8,284,560, and in U.S. Patent Publication Nos. 2011-0189925 and 2012-0276661. The drive and sense circuitry 166 can be located in the same recess 128 or a different portion of the platen 120, or could be located outside the platen 120 and be coupled to the components in the platen through a rotary electrical union 129.

In operation the drive and sense circuitry 166 drives the coil 164 to generate an oscillating magnetic field. At least a portion of magnetic field extends through the polishing pad 110 and into substrate 10. If a conductive layer is present on substrate 10, the oscillating magnetic field generates eddy currents in the conductive layer. The eddy currents cause the conductive layer to act as an impedance source that is coupled to the drive and sense circuitry 166. As the thickness of the conductive layer changes, the impedance changes, and this can be detected by the drive and sense circuitry 166.

Alternatively or in addition, an optical monitoring system, which can function as a reflectometer or interferometer, can be secured to the platen 120 in the recess 128. If both systems are used, the optical monitoring system and eddy current monitoring system can monitor the same portion of the substrate.

The CMP apparatus 100 can also include a position sensor 180, such as an optical interrupter, to sense when the core 162 is beneath the substrate 10. For example, the optical interrupter could be mounted at a fixed point opposite the carrier head 140. A flag 182 is attached to the periphery of the platen. The point of attachment and length of flag 182 is selected so that it interrupts the optical signal of sensor 180 while the core 162 sweeps beneath substrate 10. Alternatively or in addition, the CMP apparatus can include an encoder to determine the angular position of platen.

A controller 190, such as a general purpose programmable digital computer, receives the intensity signals from the eddy current monitoring system 160. The controller 190 can include a processor, memory, and I/O devices, as well as an output device 192 e.g., a monitor, and an input device 194, e.g., a keyboard.

The signals can pass from the eddy current monitoring system 160 to the controller 190 through the rotary electrical union 129. Alternatively, the circuitry 166 could communicate with the controller 190 by a wireless signal.

Since the core 162 sweeps beneath the substrate with each rotation of the platen, information on the conductive layer thickness is accumulated in-situ and on a continuous real-time basis (once per platen rotation). The controller 190 can be programmed to sample measurements from the monitoring system when the substrate generally overlies the core 162 (as determined by the position sensor). As polishing progresses, the thickness of the conductive layer changes, and the sampled signals vary with time. The time varying sampled signals may be referred to as traces. The measurements from the monitoring systems can be displayed on the output device 192 during polishing to permit the operator of the device to visually monitor the progress of the polishing operation.

In operation, the CMP apparatus 100 can use the eddy current monitoring system 160 to determine when the bulk of the filler layer has been removed and/or to determine when the underlying stop layer has been substantially exposed. Possible process control and endpoint criteria for the detector logic include local minima or maxima, changes in slope, threshold values in amplitude or slope, or combinations thereof.

The controller 190 may also be connected to the pressure mechanisms that control the pressure applied by carrier head 140, to carrier head rotation motor 154 to control the carrier head rotation rate, to the platen rotation motor 121 to control the platen rotation rate, or to slurry distribution system 130 to control the slurry composition supplied to the polishing pad. In addition, the computer 190 can be programmed to divide the measurements from the eddy current monitoring system 160 from each sweep beneath the substrate into a plurality of sampling zones, to calculate the radial position of each sampling zone, and to sort the amplitude measurements into radial ranges, as discussed in U.S. Pat. No. 6,399,501. After sorting the measurements into radial ranges, information on the film thickness can be fed in real-time into a closed-loop controller to periodically or continuously modify the polishing pressure profile applied by a carrier head in order to provide improved polishing uniformity.

Figure 3:
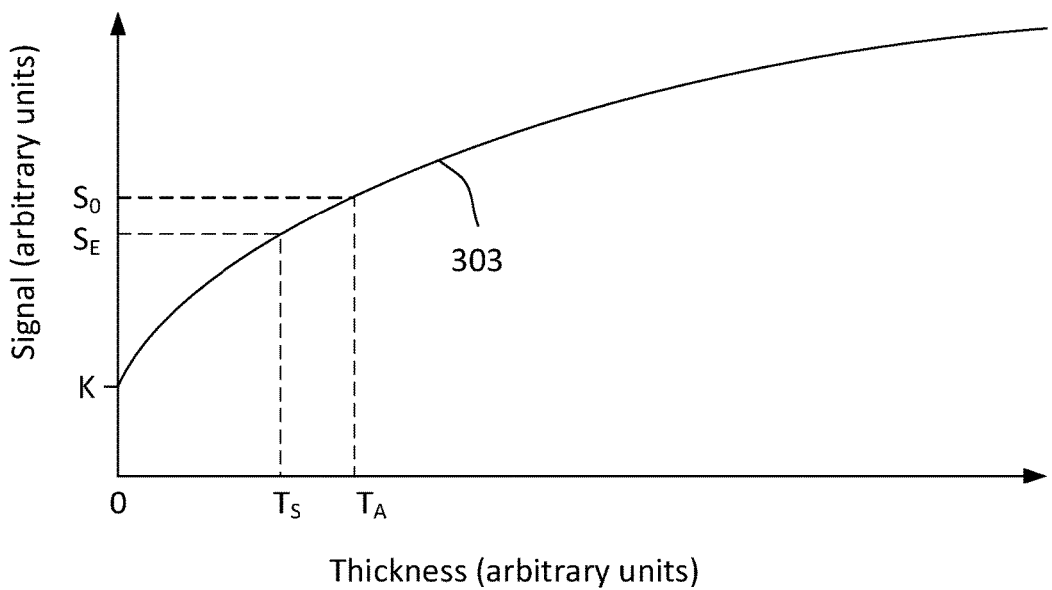
FIG. 3 is a schematic graph of signal strength as a function of thickness of a layer on the substrate.

The controller 190 can use a correlation curve that relates the signal measured by the in-situ monitoring system 160 to the thickness of the layer being polished on the substrate 10 to generate an estimated measure of the thickness of the layer being polished. An example of a correlation curve 303 is shown in FIG. 3. In the coordinate system depicted in FIG. 3, the horizontal axis represents the value of the signal received from the in-situ monitoring system 160, whereas the vertical axis represents the value for the thickness of the layer of the substrate 10. For a given signal value, the controller 190 can use the correlation curve 303 to generate a corresponding thickness value. The correlation curve 303 can be considered a "static" formula, in that it predicts a thickness value for each signal value regardless of the time or position at which the sensor head obtained the signal. The correlation curve can be represented by a variety of functions, such as a polynomial function, or a look-up table (LUT) combined with linear interpolation.

Figure 2:
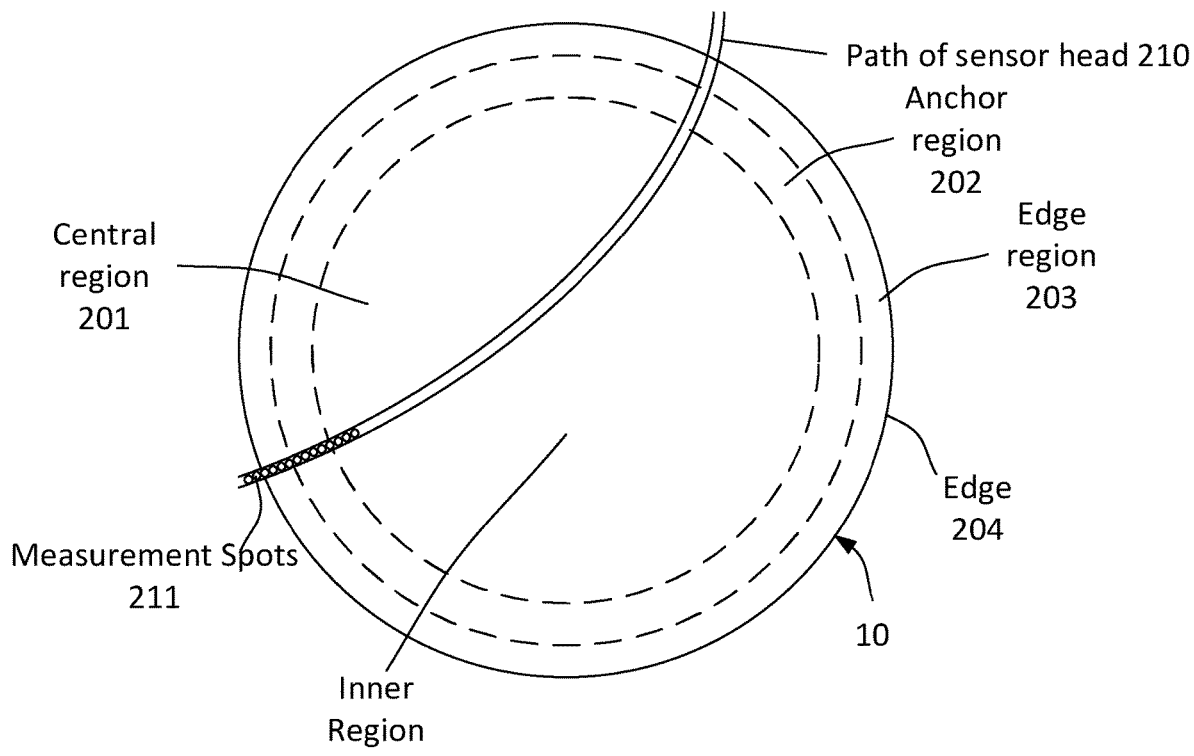
FIG. 2 is a schematic top view of a substrate being scanned by a sensor head of a polishing apparatus.

Referring to FIGS. 1B and 2, changes in the position of the sensor head with respect to the substrate 10 can result in a change in the signal from the in-situ monitoring system 160. That is, as the sensor head scans across the substrate 10, the in-situ monitoring system 160 will make measurements for multiple regions 94, e.g., measurement spots, at different locations on the substrate 10. The regions 94 can be partially overlapping (see FIG. 2).

Figure 4:
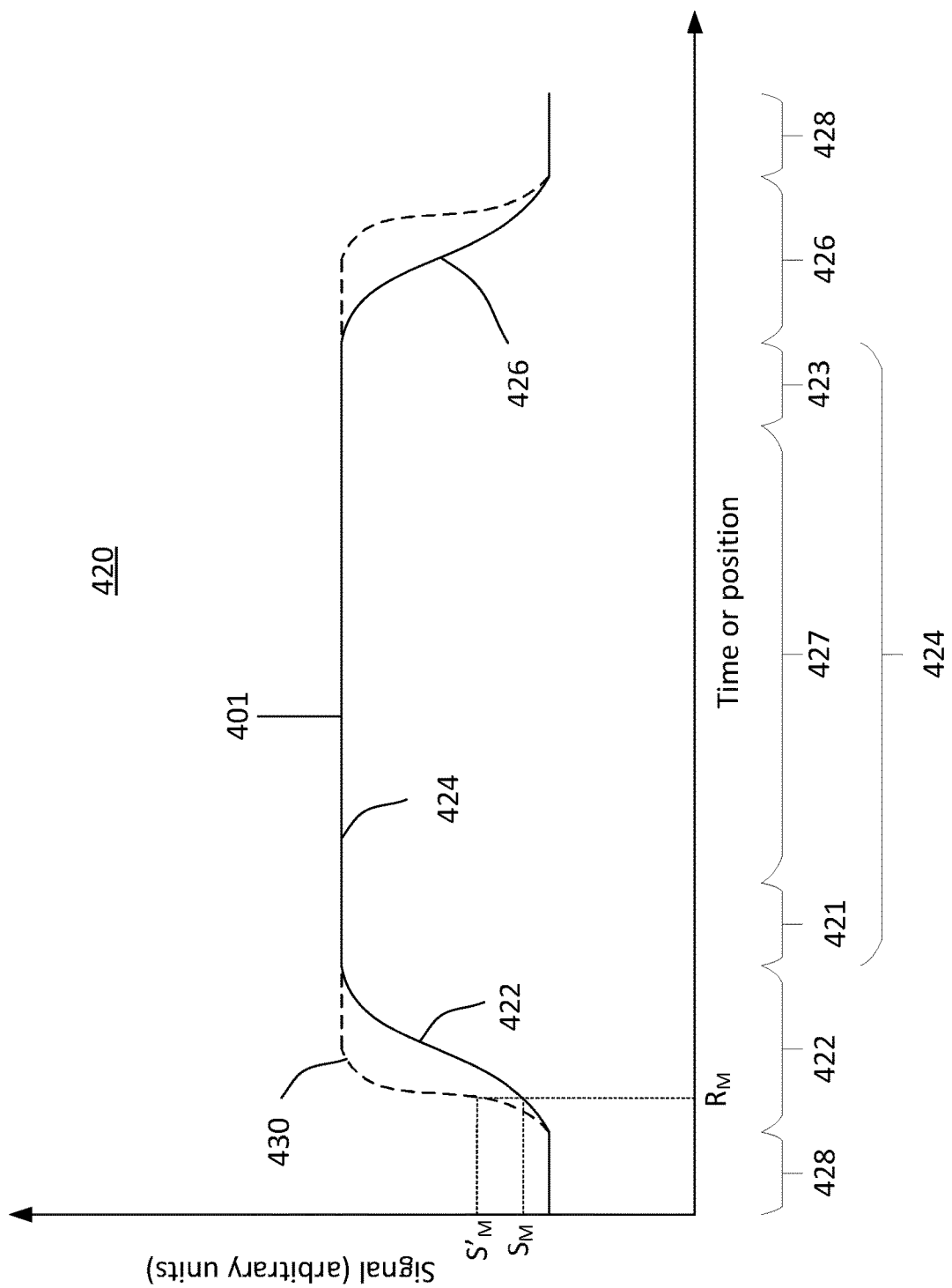
FIG. 4 is a schematic graph of measured signals obtained in a single scan of a sensor across a substrate.

FIG. 4 illustrates a graph 420 that shows a signal 401 from the in-situ monitoring system 160 during a single pass of the sensor head below the substrate 10. Although illustrated as a solid line, the signal 401 is composed of a series of individual measurements from the sensor head as it sweeps below the substrate. The graph 420 can be a function of measurement time or of position, e.g., radial position, of the measurement on the substrate. In either case, different portions of the signal 401 correspond to measurement spots 94 at different locations on the substrate 10 scanned by the sensor head. Thus, the graph 420 depicts, for a given location of the substrate scanned by the sensor head, a corresponding measured signal value from the signal 401.

Referring to FIGS. 2 and 4, the signal 401 includes a first portion 422 that corresponds to locations in an edge region 203 of the substrate 10 when the sensor head crosses a leading edge of the substrate 10, a second portion 424 that corresponds to locations in a central region 201 of the substrate 10, and a third portion 426 that corresponds to locations in edge region 203 when the sensor head crosses a trailing edge of the substrate 10. The signal can also include portions 428 that correspond to off-substrate measurements, i.e., signals generated when the sensor head scans areas beyond the edge 204 of the substrate 10 in FIG. 2.

The edge region 203 can correspond to a portion of the substrate where measurement spots 94 of the sensor head overlap the substrate edge 204. The central region 201 can include an annular anchor region 202 that is adjacent the edge region 203, and an inner region 205 that is surrounded by the anchor region 202. The sensor head may scan these regions on its path 210 and generate a sequence of measurements that correspond to a sequence of locations along the path 210.

In the first portion 422, the signal intensity ramps up from an initial intensity (typically the signal resulting when no substrate and no carrier head is present) to a higher intensity. This is caused by the transition of the monitoring location from initially only slightly overlapping the substrate at the edge 204 of the substrate (generating the initial lower values) to the monitoring location nearly entirely overlapping the substrate (generating the higher values). Similarly, in the third portion 426, the signal intensity ramps down when the monitoring location transitions to the edge 204 of the substrate.

Although the second portion 424 is illustrated as flat, this is for simplicity, and a real signal in the second portion 424 would likely include fluctuations due both to noise and to variations in the layer thickness. The second portion 424 corresponds to the monitoring location scanning the central region 201. The second portion 424 includes sub-portions 421 and 423 that are caused by the monitoring location scanning the anchor region 202 of the central region 201 and sub-portion 427 that is caused by the monitoring location scanning the inner region 205 of the central region 201.

As noted above, the variation in the signal intensity in the regions 422, 426 is caused in part by measurement region of the sensor overlapping the substrate edge, rather than an intrinsic variation in the thickness or conductivity of the layer being monitored. Consequently, this distortion in the signal 401 can cause errors in the calculating of a characterizing value for the substrate, e.g., the thickness of the layer, near the substrate edge. To address this problem, the controller 190 can include a module 196 configured by machine learning to generate a modified signal corresponding to one or more locations of the substrate 10 based on the measured signals corresponding to those locations. For example, the module 196 can include a neural network, e.g., the neural network 500 of FIG. 5, and can be implemented with software. The module is configured to, when trained appropriately, generate modified signals that reduce and/or remove the distortion of computed signal values near the substrate edge.

However, before the measured signals are input to the module 196, the signals can be modified to compensate for drift of environmental parameters, e.g., temperature of the eddy current sensor itself and/or the thickness of the polishing pad.

A measurement of the substrate from an in-line or stand-alone metrology station can be used in conjunction of measurements from the in-situ eddy current sensor to calibrate a gain of the eddy current monitoring system. For example, a desired starting signal from the in-situ eddy current sensor can determined based on the measurement from the metrology station and the calibration curve. The gain or an adjustment for the gain can then be calculated based on a comparison of the expected starting signal to the actual starting signal from the in-situ eddy current sensor.

In some implementations, the calibrations can be performed using equation (1) below to calculate the gain:

$$G=(S_E-K)/(S_0-K) \qquad (1)$$

where $S_0$ is a starting signal value, i.e., an eddy current signal measured at the beginning of polishing, $S_E$ is the signal expected at the beginning of polishing given a known starting layer thickness, and K is a constant representing a desired value at either zero thickness of the layer or at an off-wafer location. K can be set to a default value.

In particular, referring to FIG. 3, prior to polishing, the starting thickness $T_S$ of the layer to be polished is measured at an in-line or stand-alone metrology station. The expected signal $S_E$ can be calculated using the correlation curve 303.

Figure 5:
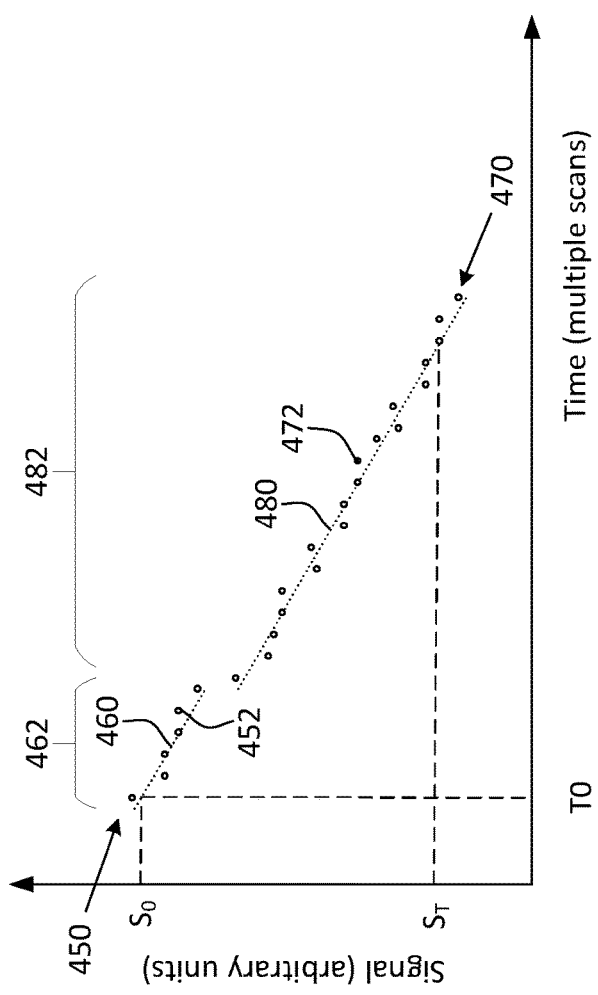
FIG. 5 is a schematic graph of measured signals as a function of time (over multiple scans of the substrate).

FIG. 5 illustrates a time-varying signal 450, i.e., a trace, e.g., composed of individual signal values 452. In some implementations, one or more signal values are selected or combined from multiple signals values accumulated over a certain time period, and these signal values are used to form the trace 450. For example, for each scan of the eddy current sensor across the substrate, one value 452 can be generated based on the various signal values accumulated during the sweep. For example, for each sweep, signal values from the second portion 424 that corresponds to locations in a central region 201 of the substrate 10 (see FIG. 3) could be averaged. However, many other techniques are possible; all of the signal values can be used, or a highest or lowest value from the sweep can be used. In addition, the signal values can be divided by zones on the substrate, and separate traces generated for each zone; in this case, the central zone can be used to for determination of $S_0$.

Once polishing begins, a starting signal value $S_0$ for the substrate can be measured or calculated. For example, a function 460, e.g., a linear function, can be fit to the signal values accumulated during an initial portion 462 of the polishing process. The starting value $S_0$ at an initial time $T_0$ can be calculated from the fitted function. The time $T_0$ is not necessarily the exact start time for the polishing operation, e.g., the time that the substrate is lowered into contact with the polishing pad, but could be several seconds, e.g., 2 or 3 seconds, thereafter. Without being limited to any particular theory, using the time that the substrate is lowered into contact with the polishing pad can give an artificially high signal value since the polishing rate can initially be limited, e.g., due to the fact that the platen is still ramping up to the target rotation rate.

With the starting signal value $S_0$ and the expected signal value $S_E$ is determined, the gain can be calculated, e.g., as $G=(S_E-K)/(S_0-K)$. For a remaining portion 482 of the polishing operation, the raw signal values from the sensor can be multiplied by the gain G to generated adjusted signal values 472, that provide an adjusted trace 470. A function 480, e.g., a linear function, can be fit to the signal values accumulated during the remaining portion 482 of the polishing process. Endpoint can be called at a calculated time that the function 480 reaches a threshold signal value ST.

In addition to adjusting the signal by the gain as discussed above, some or all of the signal from a scan can be scaled based on the thickness of the polishing pad to compensate for changes in thickness of the polishing pad. In some implementations, only the portions of the signal from the edge region and anchor region are adjusted, e.g., regions 422, 421, 423 and 426 (see FIG. 4). In some implementations, only the portions of the signal from the edge region are adjusted. The polishing pad thickness can be represented as either an actual thickness (e.g., depth between the polishing surface and bottom surface of the pad), or as an amount of pad wear (e.g., difference between a starting actual thickness of the pad and a current thickness).

In order to adjust polishing pad thickness, the pad wear or pad thickness needs to be determined. The pad wear or pad thickness can be determined by measurements from the eddy current sensor. A variety of techniques are possible for determining the pad wear or pad thickness.

Figure 6:
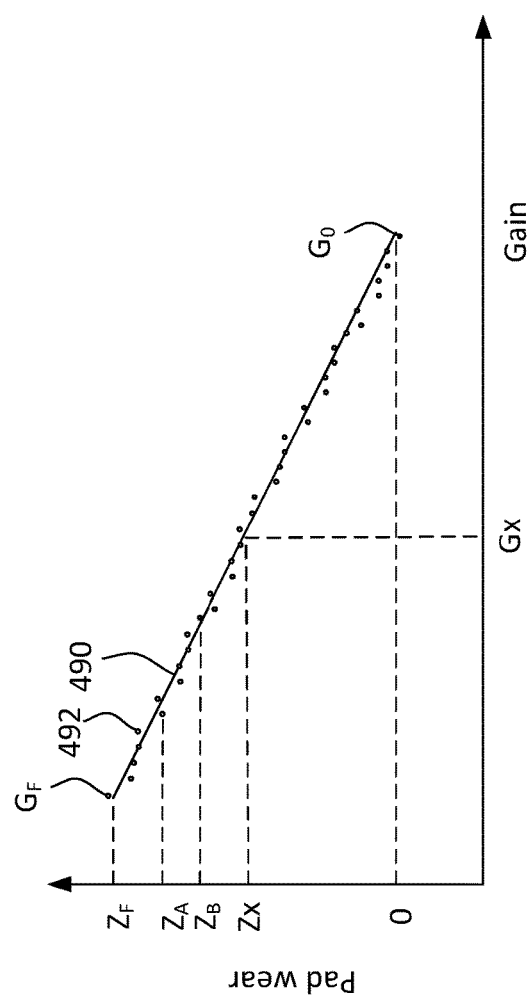
FIG. 6 is a schematic graph of pad thickness as a function of gain.

As one example, the gain G that is calculated for polishing of a substrate can be also used to determine the pad wear. FIG. 6 illustrates a correlation function 490 showing a relationship between the gain G and the pad wear Z. Since the signal strength tends to increase as the actual pad thickness decreases and pad wear increases, the correlation function 490 can have a negative slope.

The correlation function 490 can be generated empirically from gain values calculated during polishing of multiple substrates. One technique for generating such a correlation function is discussed below. A starting thickness $P_0$ of the polishing pad can be measured before or after the polishing pad is installed on the platen, but before substrates have been polished. A series of substrates is then polished using the polishing pad, the gain G is for each substrate is calculated and stored, and the pad is conditioned during and/or after each substrate is polished. This generates a sequence of gain values $G_0, G_1, \ldots G_F$.

A final thickness $P_F$ of the polishing pad can be measured, e.g., after the polishing pad has been removed from the platen. The difference between the starting thickness $P_0$ and the final thickness $P_F$ provides a measure of the pad wear $Z_F$.

The polishing pad can be assumed to wear at a linear rate; this permits a pad wear value to be calculated for each gain value by interpolation from the starting and final pad wear values $Z_0$ (which can be 0) and $Z_F$, respectively. For example, if 100 substrates are polished, then the pad thickness value for the $25^{th}$ substrate can be calculated as 25% of the way between 0 and $Z_F$. The pairs of gain and pad wear values provide a set of points 492 in a 2D space of gain versus pad wear. A function, e.g., a linear or polynomial function, can be fit to this set of points, thus generating the correlation function 490. The correlation function 490 can implemented by a variety techniques, such as a polynomial function, or a look-up table (LUT) combined with linear interpolation. An amount of pad wear Zx can then be calculated for an arbitrary gain Gx using the correlation function 490.

Alternatively or in addition, the thickness of the polishing pad can be measured at one or more times during the run of polishing of the series of substrates, e.g., at regular or irregular intervals, while the polishing pad is still on platen. This permits generation of additional specifically measured pad wear value, e.g. $Z_A$, $Z_B$. The correlation function 490 can be generated by fitting a function to just the pairs of specifically measured pad wear values and their associated gain values. Or pad wear values between the specifically measured pad wear values could be calculated for each gain value interpolation from the adjacent specifically measured pad wear values. In this case, the correlation function could be generating by fitting a function to the specific pad wear values and interpolated pad wear values (and their associated gain values).

As another example, the signal value when the sensor passes below a conductive body of known thickness, e.g., the conditioning disk 176 (see FIG. 1), can be measured. In general, the closer the conductive body (i.e., the thinner the polishing pad 110) to the sensor, the stronger the signal strength. An experimentally determined calibration curve, e.g., stored as a look-up table, can be used to calculate the polishing pad thickness.

Once the polishing pad thickness (either as an amount of wear or actual thickness) has been determined, a selected portion of the signal from a scan can be adjusted based on the polishing pad thickness. This can compensate for changes in sensitivity of the sensor due to changes in the thickness of the polishing pad. As noted above, in some implementations, the selected portion of the signal is only the portion from the edge region and anchor region, e.g., regions 422, 421, 423 and 426 (see FIG. 4).

In some implementations, the selected portion of the signal is subject to a convolution to generate a corrected portion of the signal. This convolution can be a function of the pad wear.

For example, a corrected signal can be calculated in accordance with $$f(y) = \int dx\, RAW(x) G_\sigma(x-y) \quad (2)$$

where f(y) is the corrected profile, RAW(x) is the signal strength as a function of radial position x (possibly already adjusted for gain using equation 1 above). The function $G\sigma$ can be given by $$G_\sigma(x) = \frac{1}{\sqrt{2\pi}\sigma} e^{-\frac{x^2}{2\sigma^2}}$$

where $$\sigma = k * Z$$

with Z being the amount pad wear for the substrate, and k being a constant determined from empirical data, e.g., k=0.278.

Once the corrected profile f(y) is calculated, it can be input to the module 196.

The polishing apparatus 100 can use the neural network 500 to generate modified signals. The modified signals can then be used to determine a thickness for each location in a first group of locations of a substrate, e.g., the locations in the edge region (and possibly the anchor region). For example, referring back to FIG. 4, the modified signal values for the edge region can provide a modified portion 430 of the signal 401.

The modified signals values 430 can be converted to thickness measurements using a static formula, e.g., the correlation curve. For example, the controller 190 can use the neural network 500 to determine a thickness of an edge location and one or more anchor locations of the substrate. In contrast, the controller 190 can generate thickness measurements for other regions, e.g., the inner region 205, directly using the static formula. That is, signal values from other regions, e.g., the inner region 205, can be converted to thickness values without having been modified by the neural network.

In some implementations, one or more modified signal values are recombined with the un-modified signal values, e.g., using a weighted averaging, and the resulting combined signal value is converted to a thickness value using the static formula, e.g., the correlation curve. For example, combined signal values corresponding to locations in a region between the edge region 203 and the central region (for signal 427), e.g., locations in the anchor region 202, can be generated by a weighted average of the modified signal values (generated by the neural network) and the original measured values. The weighting can vary as a function of the location of the measurement on the substrate. In particular, locations closer to the center can be weighted relatively more heavily toward the measured signal values, and locations closer to the edge can be weighted relatively more heavily toward the modified signal values. This can provide a smooth transition between the portion of the signal that was generated by the neural network and the portion of the signal that was not. In some implementations, the region in which the signal values are recombined can extend up to the edge of the substrate.

Figure 7:
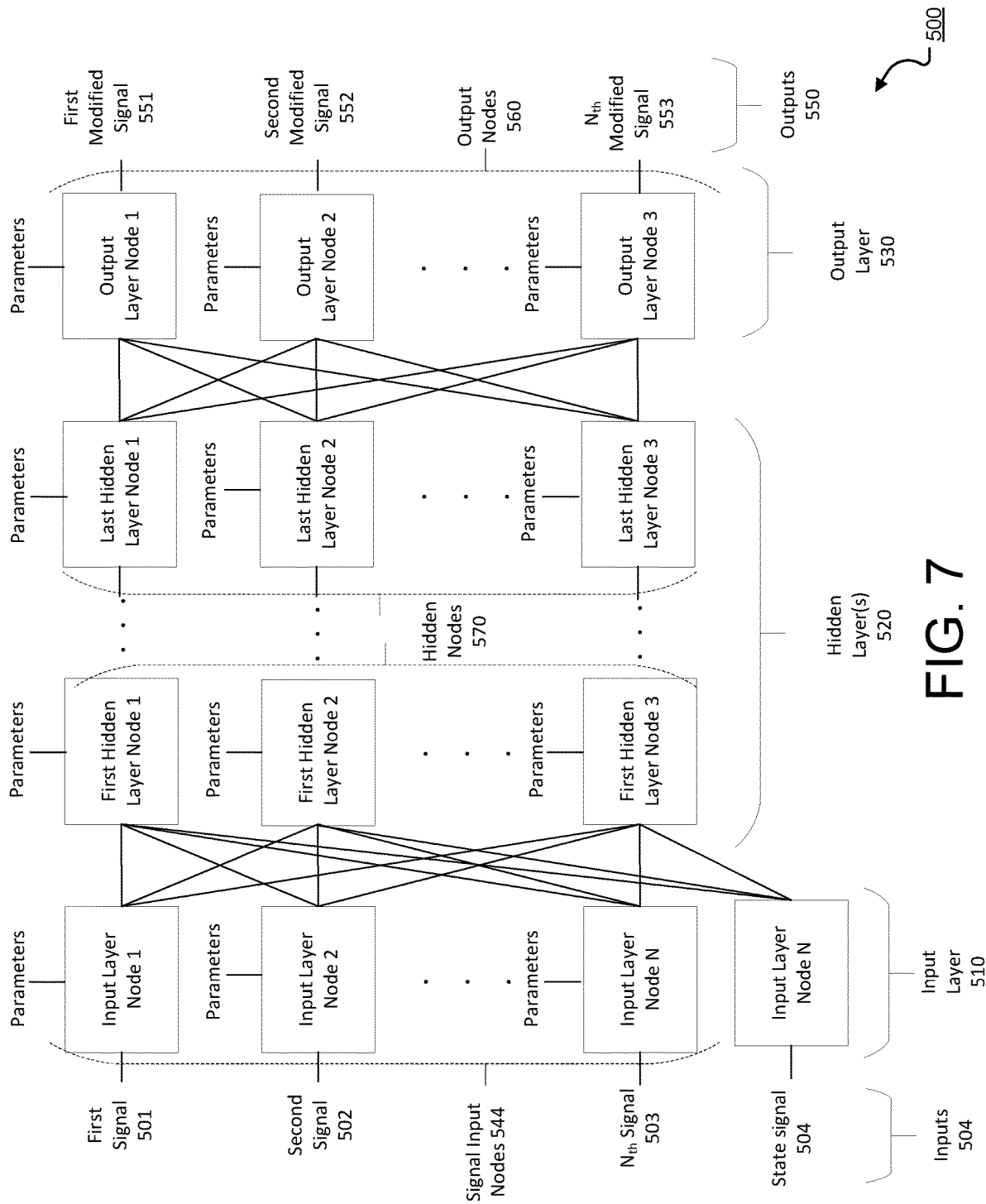
FIG. 7 is a schematic illustration of a neural network.

Referring now to FIG. 7, the neural network 500 receives a group of inputs 504 and processes the inputs 504 through one or more neural network layers to generate a group of outputs 550. The layers of the neural network 500 include an input layer 510, an output layer 530, and one or more hidden layers 520.

Each layer of the neural network 500 includes one or more neural network nodes. Each neural network node in a neural network layer receives one or more node input values (from the inputs 504 to the neural network 500 or from the output of one or more nodes of a preceding neural network layer), processes the node input values in accordance with one or more parameter values to generate an activation value, and optionally applies a non-linear transformation function (e.g., a sigmoid or tanh function) to the activation value to generate an output for the neural network node.

Each node in the input layer 510 receives as a node input value one of the inputs 504 to the neural network 500.

The inputs 504 to the neural network include measured signal values from the in-situ monitoring system 160 for multiple different locations on the substrate 10, such as a first measured signal value 501, a second measured signal value 502, through an nth measured signal value 503. The measured signal values can be individual values of the sequence of values in the signal 401.

In general, the multiple different locations include locations in the edge region 203 and the anchor region 202 of the substrate 10. In some implementations, the multiple different locations are only in the edge region 203 and the anchor region 202. In other implementations, the multiple different locations span all regions of the substrate.

These measured signal values are received at signal input nodes 544. Optionally, the input nodes 504 of the neural network 500 can also include one or more state input nodes 516 that receive one or more process state signals 504, e.g., a measure of wear of the pad 110 of the polishing apparatus 100.

The nodes of the hidden layers 520 and output layer 530 are illustrated as receiving inputs from every node of a preceding layer. This is the case in a fully-connected, feedforward neural network. However, the neural network 500 may be a non-fully-connected feedforward neural network or a non-feedforward neural network. Moreover, the neural network 500 may include at least one of one or more fully-connected, feedforward layers; one or more non-fully-connected feedforward layers; and one or more non-feedforward layers.

The neural network generates a group of modified signal values 550 at the nodes of the output layer 530, i.e., "output nodes" 550. In some implementations, there is an output node 550 for each measured signal from the in-situ monitoring system that is fed to the neural network 500. In this case, the number of output nodes 550 can correspond to the number of signal input nodes 504 of the input layer 510.

For example, the number of signal input nodes 544 can equal the number of measurements in the edge region 203 and the anchor region 202, and there can be an equal number of output nodes 550. Thus, each output node 550 generates a modified signal that corresponds to a respective measured signal supplied as an input to a signal input node 544, e.g., the first modified signal 551 for the first measured signal 501, the second modified signal 5552 for the second measured signal 502, and the nth modified signal 553 for the nth measured signal 503.

In some implementations, the number of output nodes 550 is smaller than the number of input nodes 504. In some implementations, the number of output nodes 550 is smaller than the number of signal input nodes 544. For example, the number of signal input nodes 544 can equal the number of measurements in the edge region 203, or equal to the number of measurements in the edge region 203 and anchor region 202. Again, each output node 550 of the output layer 530 generates a modified signal that corresponds to a respective measured signal supplied as a signal input node 504, e.g., the first modified signal 551 for the first measured signal 501, but only for the signal input nodes 554 that receive signals from the edge region 203.

In some implementations, for a modified signal value that corresponds to a given measurement location, the neural network 500 can be configured such that only input signal values from measurement locations within a predetermined distance of that given location are used in determining the modified signal value. For example, if signal values $S_1, S_2, S_M, \ldots S_N$ are received, corresponding to measurements at N successive locations on the path 210, a modified signal value $S'_M$ for the Mth location (indicate at $R_M$) can use only the signal values $S_{M-L(min\ 1)}, \ldots S_M, \ldots S_{M+L(max\ N)}$ to calculate the modified signal value $S'_M$. The value of L can be selected such that measurements that are up to about 2-4 mm apart are used to generate a given modified signal value $S'_M$; measurements within about 1-2 mm, e.g., 1.5 mm, of the location of the measurement $S_M$ can be used. For example, L can be a number from the range 0 to 4, e.g., 1 or 2. For example, if measurements within 3 mm are used, and the spacing between measurements is 1 mm, then L can be 1; if the spacing is 0.5 mm, then L can be 2; if the spacing is 0.25 then L can be 4. However, this can depend on the configuration of the polishing apparatus and the processing conditions. Values of other parameters, e.g., pad wear, could still be used in calculating the modified signal value $S'_M$.

For example, there can be a number of hidden nodes 570 of the one or more hidden layers 520, i.e., "hidden nodes" 570, equal to the number of signal input nodes 544, with each hidden node 570 corresponding to a respective signal input node 544. Each hidden node 570 can be disconnected from (or have a parameter value of zero for) input nodes 544 that correspond to measurements for locations greater than the predetermined distance from the location of the measurement of the corresponding input node. For example, the $M^{th}$ hidden node can be disconnected from (or have a parameter value of zero for) the $1^{st}$ through $(M-L-1)^{th}$ input nodes 544 and the $(M+L+1)^{th}$ through $N^{th}$ input nodes. Similarly, each output node 560 can be disconnected from (or have a parameter value of zero for) hidden nodes 570 that correspond to the modified signals for locations that are greater than the predetermined distance from the location of the measurement of the output node. For example, the $M^{th}$ output node can be disconnected from (or have a parameter value of zero for) the $1^{st}$ through $(M-L-1)^{th}$ hidden nodes 570 and the $(M+L+1)^{th}$ through $N^{th}$ hidden nodes.

In some embodiments, the polishing apparatus 100 can use the static formula to determine a thickness of multiple locations, e.g., locations within the edge region, of a first group of substrates. These substrates can be used to generate training data that is used to train the neural network. Then the polishing apparatus 100 can use the neural network 500 to generate modified signals used to determine a thickness of multiple locations, e.g., locations within the edge region of a second group of substrates. For example, the polishing apparatus 100 can apply the static formula to determine thickness values for the first group of substrates, and use the trained neural network 500 to generate modified signals used to determine thickness values for the second group of substrates.

Figure 8:
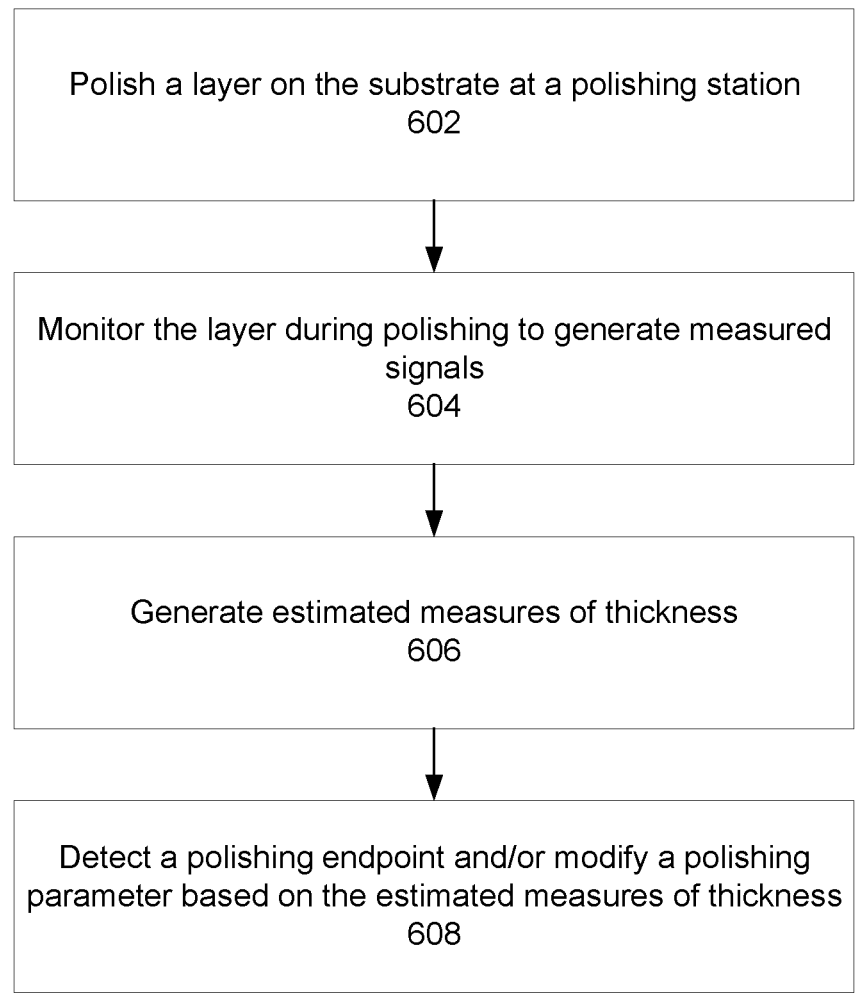
FIG. 8 is a flow diagram of an example process for polishing a substrate.

FIG. 8 is a flow-diagram of an example process 600 for polishing a substrate 10. The process 600 can be performed by the polishing apparatus 100.

The polishing apparatus 100 polishes (602) a layer on the substrate 10 and monitors (604) the layer during the polishing to generate measured signal values for different locations on the layer. The locations on the layer can include one or more locations within the edge region 203 of the substrate (corresponding to the regions 422/426 of the signal 401), and one or more locations within an anchor region 202 on the substrate (corresponding to regions 421/423 of the signal). The anchor region 202 is spaced away from the substrate edge 204 and within a central region 201 of the substrate, and thus is not affected by the distortion created by the substrate edge 204. However, the anchor region 202 can be adjacent to the edge region 203. The anchor region 202 can also surround the inner region 205 of the central region 201. The number of anchor locations can depend on the measurement spot size and measurement frequency by the in-situ monitoring system 160. In some embodiments, the number of the anchor locations cannot exceed a maximum value, such as a maximum value of 4.

The polishing apparatus 100 generates an estimated measure of thickness for each location of the different locations based on the measured signal for the location (606). This includes processing the measured signals through the neural network 500.

The inputs to the neural network 500 may be raw measured signals generated by the in-situ monitoring system 160 for the different locations or updated measured signals. In some embodiments, the apparatus 100 updates each measured signal by normalizing the value of the signals. Such normalization can increase the likelihood that at least some of the inputs 504 to the neural network system 500 fall within a particular range, which in turn can increase the quality of training of the neural network and/or the accuracy of the inference made by the neural network 500. This normalization is optional, and in some embodiments is not performed.

The outputs of the neural network 500 are modified signals each corresponding to an input measured signal. If the measured signals are normalized values, the modified signals corresponding to the measured signals will also be normalized values. Therefore, the polishing apparatus 100 may need to convert such modified signals to non-normalized values before using modified signals to estimate thickness of substrate.

The polishing apparatus 100 detects (608) a polishing endpoint and/or modify a polishing parameter based on each estimated measures of thickness.

Figure 9:
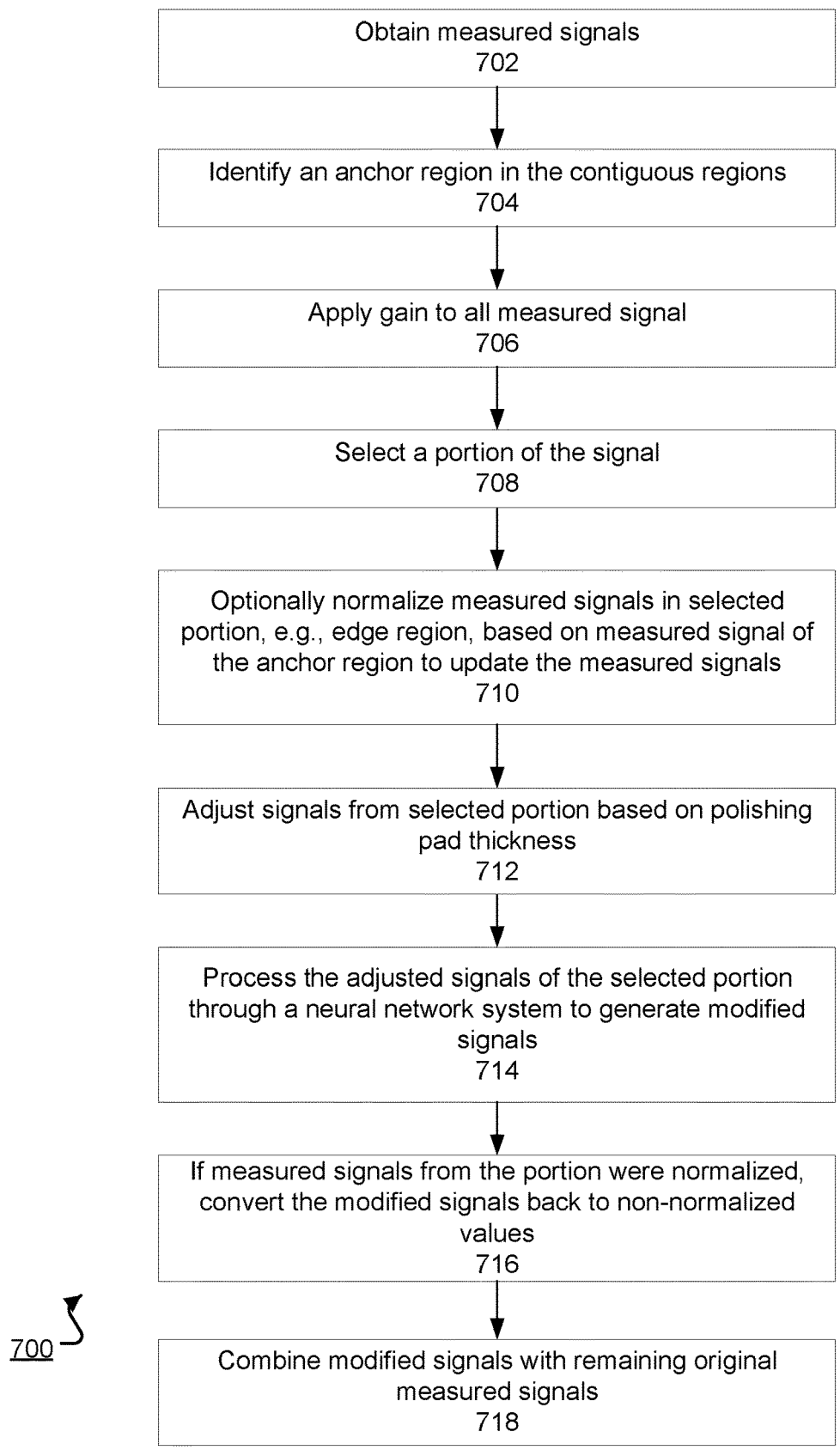
FIG. 9 is a flow diagram of an example process for generating estimated measures of thickness using a neural network.

FIG. 9 is a flow diagram of an example process 700 for generating estimated measures of thickness using a neural network 500. The process 700 can be performed by the controller 190.

The controller receives measured signal values for each location of the group of locations (702). The locations can be in a sweep across the substrate. The controller 190 identifies which locations correspond to an edge region, which locations correspond to an anchor region, and which locations correspond to a central region of the substrate (704). In some embodiments, the anchor location is spaced away from the edge of the substrate.

The controller then applies a gain to the measured signal values (706). This gain can be applied to all of the signal values, including measurements from the edge region, the anchor region, and the central region of the substrate.

The controller selects a portion of the signal (708). The selected portion can be the measurements corresponding to the anchor region and the edge region.

Optionally, the controller 190 can normalize (710) each measured signal value in the selected portion based on a measured signal strength in of the anchor location, e.g., by dividing each measured signal value in the selected portion by the measured signal strength of the anchor location, to update the measured signals.

In addition, the controller 190 can adjust each measured (and optionally normalized) signal value in the selected portion based on polishing pad thickness (712). For example, a convolution can be performed on the signal using a Gaussian function of the pad wear.

The controller 190 then processes the updated measured signal values through the neural network 500 to generate modified signal values for each adjusted signal (714). If the measured signal values were normalized by dividing by the signal strength in the anchor region, the controller 190 can converts the modified signal values back to non-normalized adjusted signal values using the measured signal strength of the anchor location (716), e.g., by multiplying each measured signal value by the measured signal strength of the anchor location, to update the measured signal values. However, if the measured signal values were not normalized, this step can be omitted.

A signal that represents the full scan across the substrate can then be constructed from the modified signal values for the selected portion of the signal and the original measured signal values for the portion that was not selected (i.e., a remainder) (718). In some implementations, the modified signal values can be combined with the non-modified signal values, e.g., using an average weighted based on the location of the measurement, to generate combined signal values.

The controller 190 then uses the signal values (modified or original or combined) to generate an estimated measure of thickness of each location (see step 606 in FIG. 7), e.g., using the correlation function. By doing so, the controller 190 uses the modified signal values to generate an estimated measure of thickness for each location of the group of locations of the measurements input to the neural network 500.

Figure 10:
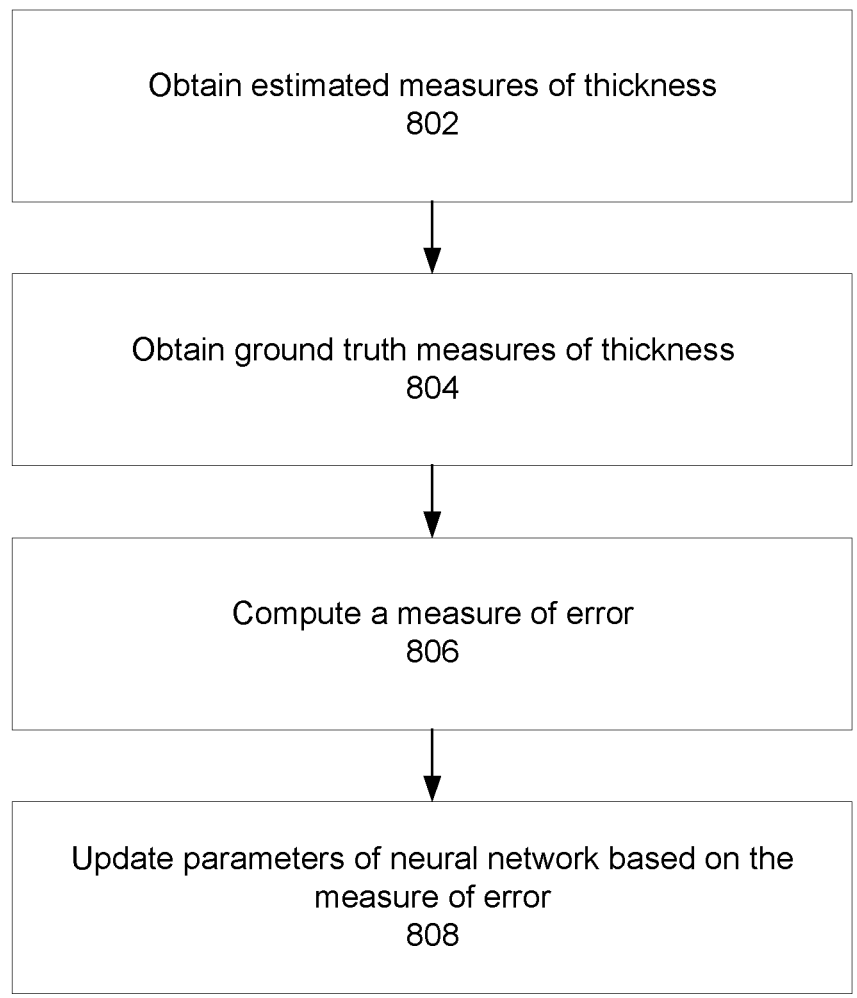
FIG. 10 is a flow diagram of an example process for training a neural network to generate modified signals for a group of measured signals.

FIG. 10 is a flow diagram of an example process 800 for training a neural network 500 to generate modified signals for a group of measured signals. The process 800 can be performed by a system of one or more computers configured to train the neural network 500.

The system obtains (802) estimated measures of thickness generated by the neural network 500 based on input values that include measured signals for each location in a group of locations of the substrate. The system also obtains (804) ground truth measures of thickness for each location in the group of locations. The system can generate ground truth measures of thickness using an electrical impedance measuring method, such as the four-points probe method.

The system computes (806) a measure of error between the estimated measures of thickness and the ground truth measures of thickness and updates one or more parameters of the neural network 500 based on the measure of error. To do so, the system may use a training algorithm that uses gradient descent with backpropagation.

The monitoring system can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

Although the discussion above focuses on an eddy current monitoring system, the correction techniques can be applied to other sorts of monitoring systems, e.g., optical monitoring systems, that scan over an edge of substrate. In addition, although the discussion above focuses on a polishing system, the correction techniques can be applied to other sorts of substrate processing systems, e.g., deposition or etching systems, that include an in-situ monitoring system that scans over an edge of substrate.

The functional operations described in this specification can be implemented in digital electronic circuitry, or in computer software, firmware, or hardware, including the structural means disclosed in this specification and structural equivalents thereof, or in combinations of them. Embodiments can be implemented as one or more computer program products, i.e., one or more computer programs tangibly embodied in an information carrier, e.g., in a non-transitory machine readable storage medium or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

A number of embodiments have been described. Nevertheless, it will be understood that various modifications may be made without departing from the spirit and scope of this disclosure. Accordingly, other embodiments are within the scope of the following claims.

What is claimed is:

1. A computer storage medium encoded with instructions that, when executed by one or more computers, cause the one or more computers to perform operations comprising:
   receiving data from an in-situ eddy current monitoring system, the data including, for each scan of a plurality of scans of a sensor of the in-situ eddy current monitoring system of a conductive layer of a substrate being polished by a polishing pad, a plurality of measured signal values for a plurality of different locations on the conductive layer;
   determining a measured thickness of the polishing pad based on the data from the in-situ eddy current monitoring system,
   for each scan of the plurality of scans, generating, for each location of the plurality of different locations, a value representing a thickness of the conductive layer at the location, thereby providing a plurality of values representing thicknesses at the plurality of different locations, wherein the generating includes processing at least the plurality of measured signal values and the measured thickness of the polishing pad using one or more processors configured by machine learning, and
   at least one of detecting a polishing endpoint or modifying a polishing parameter based on the plurality of values representing the thicknesses at the plurality of different locations.

2. The computer storage medium of claim 1, wherein processing at least the plurality of measured signal values and the measured thickness of the polishing pad includes applying at least some of the plurality of measured signal values to a plurality of first input nodes of a trained neural network and applying the measured thickness of the polishing pad to a second input node of the trained neural network.

3. The computer storage medium of claim 2, wherein the operations comprise applying a group of measured signal values which is less than all of the plurality of measured signal values to the plurality of first input nodes.

4. The computer storage medium of claim 3, wherein the plurality of measured signal values includes a first group of values from locations in an edge region of the substrate and a second group of values from locations in a center region of the substrate.

5. The computer storage medium of claim 4, wherein the operations comprise applying the first group of values to the plurality of first input nodes.

6. The computer storage medium of claim 5, wherein the second group of values are not applied to the neural network.

7. The computer storage medium of claim 1, wherein determining the thickness of the polishing pad includes determining a gain for the substrate and determining the thickness of the polishing pad from a correlation function that provides pad thickness values as a function of gain.

8. The computer storage medium of claim 7, wherein determining the gain for the substrate includes determining an estimated starting thickness value of the layer based on the plurality of values representing thicknesses for a plurality of scans occurring in an initial portion of a polishing operation of the layer, receiving an initial thickness value of the layer prior to polishing, and comparing the estimated starting thickness value to the received initial thickness value.

9. The computer storage medium of claim 8, wherein the operations comprise receiving a plurality of raw thickness values from the sensor, and wherein the operations include, after determining the gain, multiplying the plurality of raw thickness values by the gain to generate the plurality of measured signal values.

10. The computer storage medium claim 1, comprising adjusting at least a portion of the plurality of measured signal values by performing a convolution on the at least the portion of the plurality of measured signal values.

11. The computer storage medium of claim 1, wherein the plurality of different locations on the layer include at least one edge location in an edge region of the substrate, at least one central location in a central region of the substrate, and at least one anchor location in an anchor region between the central region and the edge region.

12. The computer storage medium of claim 11, wherein the at least a portion of the plurality of measured signal values includes measured signal values corresponding to the edge region, includes measured signal values corresponding to the anchor region, and does not includes measured signal values corresponding to the central region.

13. The computer storage medium of claim 1, wherein generating the plurality of values representing thicknesses uses a correlation curve that provides layer thickness value as a function of signal value.

14. A polishing system, comprising:
   a support for a polishing pad;
   a carrier to hold a substrate in contact with the polishing pad;
   an in-situ eddy current monitoring system having a sensor;
   a motor to generate relative motion between the sensor and the substrate such that the sensor makes a plurality of scans across the substrate, the in-situ eddy current monitoring system configured to generate data including, for each scan of the plurality of scans, a plurality of measured signal values for a plurality of different locations on a conductive layer of the substrate; and a controller configured to
- receive data from the in-situ eddy current monitoring system, the data including, for each scan of a plurality of scans of the sensor, a plurality of measured signal values for a plurality of different locations on the conductive layer;
- determine a measured thickness of the polishing pad based on the data from the in-situ eddy current monitoring system,
- for each scan of the plurality of scans, generate, for each location of the plurality of different locations, a value representing a thickness of the conductive layer at the location, thereby providing a plurality of values representing thicknesses at the plurality of different locations, wherein the controller is configured to process at least the plurality of measured signal values and the measured thickness of the polishing pad using one or more processors configured by machine learning to generate the value representing the thickness of the conductive layer, and
- at least one of detect a polishing endpoint or modify a polishing parameter based on the plurality of values representing the thicknesses at the plurality of different locations.

15. The system of claim 14, wherein the controller is configured to process at least the plurality of measured signal values and the measured thickness of the polishing pad by applying at least some of the plurality of measured signal values to a plurality of first input nodes of a trained neural network and applying the measured thickness of the polishing pad to a second input node of the trained neural network.

16. The system of claim 15, wherein the controller is configure to apply a group of measured signal values which is less than all of the plurality of measured signal values to the plurality of first input nodes.

17. A method of polishing a substrate, comprising:
bringing the substrate into contact with a polishing pad at a polishing station;
moving the substrate relative to the polishing pad to polish a layer on the substrate;
monitoring the layer during polishing at the polishing station with a sensor of an in-situ monitoring system, the sensor moving relative to the substrate to provide a plurality of scans of the sensor across the substrate, the in-situ monitoring system generating data including, for each scan of the plurality of scans, a plurality of measured signal values for a plurality of different locations on the layer;
determining a measured thickness of the polishing pad based on the data from the in-situ monitoring system,
for each scan of the plurality of scans, generating, for each location of the plurality of different locations, a value representing a thickness of the layer at the location, thereby providing a plurality of values representing thicknesses at the plurality of different locations, wherein the generating includes processing at least the plurality of measured signal values and the measured thickness of the polishing pad using one or more processors configured by machine learning, and
at least one of detecting a polishing endpoint or modifying a polishing parameter based on the plurality of values representing the thicknesses at the plurality of different locations.

18. The method of claim 17, comprising processing at least the plurality of measured signal values and the measured thickness of the polishing pad by applying at least some of the plurality of measured signal values to a plurality of first input nodes of a trained neural network and applying the measured thickness of the polishing pad to a second input node of the trained neural network.

19. The method of claim 18, comprising applying a group of measured signal values which is less than all of the plurality of measured signal values to the plurality of first input nodes.

* * * * *